(12) United States Patent
Jeffrey et al.

(10) Patent No.: US 11,854,833 B2
(45) Date of Patent: Dec. 26, 2023

(54) SIGNAL DISTRIBUTION FOR A QUANTUM COMPUTING SYSTEM

(71) Applicant: Google LLC, Mountain View, CA (US)

(72) Inventors: Evan Jeffrey, Santa Barbara, CA (US); Joshua Yousouf Mutus, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 452 days.

(21) Appl. No.: 17/263,619

(22) PCT Filed: Jul. 30, 2018

(86) PCT No.: PCT/US2018/044387
§ 371 (c)(1),
(2) Date: Jan. 27, 2021

(87) PCT Pub. No.: WO2020/027779
PCT Pub. Date: Feb. 6, 2020

(65) Prior Publication Data
US 2021/0175095 A1 Jun. 10, 2021

(51) Int. Cl.
*H01L 21/48* (2006.01)
*G06N 10/00* (2022.01)
*H01L 23/498* (2006.01)
*H01L 33/06* (2010.01)

(52) U.S. Cl.
CPC ......... *H01L 21/4857* (2013.01); *G06N 10/00* (2019.01); *H01L 23/49822* (2013.01); *H01L 33/06* (2013.01)

(58) Field of Classification Search
CPC .......... H01L 21/4857; H01L 23/49822; G06N 10/00
See application file for complete search history.

(56) References Cited

U.S. PATENT DOCUMENTS

| 9,064,784 B1 | 6/2015 | Liu et al. |
| 2009/0008632 A1 | 1/2009 | Bunyk et al. |
| 2011/0133342 A1 | 6/2011 | Arai |

FOREIGN PATENT DOCUMENTS

| CN | 101465332 | 6/2009 |
| CN | 107768344 | 3/2018 |
| WO | WO 2018/052399 | 3/2018 |

OTHER PUBLICATIONS

Office Action in Australian Appln. No. 2018434686, dated Jul. 8, 2021, 3 pages.

(Continued)

*Primary Examiner* — Matthew L Reames
(74) *Attorney, Agent, or Firm* — Fish & Richardson P.C.

(57) ABSTRACT

A method of fabricating a carrier chip for distributing signals among circuit elements of a quantum computing device, includes: providing a multilayer wiring stack, the multilayer wiring stack comprising alternating layers of dielectric material and wiring; bonding a capping layer to the multilayer wiring stack, in which the capping layer includes a single crystal silicon dielectric layer; forming a via hole within the capping layer, in which the via hole extends to a first wiring layer of the multilayer wiring stack; forming an electrically conductive via within the via hole and electrically coupled to the first wiring layer; and forming a circuit element on a surface of the capping layer, in which the circuit element is directly electrically coupled to the electrically conductive via.

37 Claims, 10 Drawing Sheets

(56) References Cited

OTHER PUBLICATIONS

PCT International Search Report and Written Opinion in International Appln. No. PCT/US2018/044387, dated Mar. 26, 2019, 13 pages.
Notice of Acceptance in Australian Appln. No. 2018434686, dated Nov. 22, 2021, 3 pages.
Office Action in Canadian Appln. No. 3,102,773, dated Nov. 25, 2021, 4 pages.
Notice of Allowance in Chinese Appln. No. 201880094558.7, dated Sep. 7, 2023, 7 pages (with English translation).

SIGNAL DISTRIBUTION FOR A QUANTUM COMPUTING SYSTEM

CROSS-REFERENCE TO RELATED APPLICATION

This application is a National Stage Application under 35 U.S.C. § 371 and claims the benefit of International Application No. PCT/US2018/044387, filed Jul. 30, 2018. The disclosure of the foregoing application is hereby incorporated by reference in its entirety.

BACKGROUND

Quantum computing is a computing method that takes advantage of quantum effects, such as superposition of basis states and entanglement belonging to separate and remote entities to perform certain computations more efficiently than a classical digital computer. In contrast to a digital computer, which stores and manipulates the information using "bits" configured to be in two bi-stable states (e.g. a "0" and "1"), quantum computing systems aim to manipulate information using "qubits" configured to be the superposition of the quantum states (e. g. $a|0>+b|1>$). Quantum states of each qubit can be entangled with one another, i. e., the measurement result of one qubit is strongly correlated with the measurement result of another qubit.

SUMMARY

The present disclosure relates to structures and techniques for facilitating signal distribution for quantum computing systems.

In general, in some aspects, the structures covered by the present disclosure include (i) a multilayer wiring stack having alternating layers of dielectric material and wiring, such as signal lines and (ii) a capping layer bonded to the multilayer wiring stack, in which the capping layer is formed from a dielectric material having relatively low loss compared to the dielectric layers of the multilayer wiring stack. For instance, the low loss dielectric of the capping layer can include single crystal silicon or mono-crystalline silicon. Various circuit elements such as readout resonators, control lines, and/or control circuits can be formed on an exposed surface of the capping layer. The circuit elements formed on the exposed surface of the capping layer may be electrically coupled with one or more signal layers within the multilayer wiring stack through conductive vias formed within the capping layer.

The structure including the multilayer wiring stack and bonded capping layer can be coupled, e.g., through bump-bonding, to a separate chip that includes quantum computing circuit elements, such as qubits. In particular, the structure is bonded so the low-loss capping layer is located directly across from the chip having the quantum computing circuit elements.

In general, one innovative aspect of the subject matter described in this specification can be implemented in a method, in which the method includes: providing a multilayer wiring stack, the multilayer wiring stack comprising alternating layers of dielectric material and wiring; bonding a capping layer to the multilayer wiring stack, wherein the capping layer comprises a single crystal silicon dielectric layer; forming a via hole within the capping layer, wherein the via hole extends to a first wiring layer of the multilayer wiring stack; forming an electrically conductive via within the via hole and electrically coupled to the first wiring layer; and forming a circuit element on a surface of the capping layer, wherein the circuit element is directly electrically coupled to the electrically conductive via.

The foregoing and other implementations can each optionally include one or more of the following features, alone or in combination. For example, in some implementations, the capping layer comprises a silicon-on-insulator (SOI) wafer. Prior to forming the via hole, a buried oxide layer and a bulk silicon layer of the SOI wafer may be removed to expose the surface of the capping layer. A thickness of the capping layer between the multilayer carrier-wiring stack and the surface of the capping layer may be between about 2 microns and about 20 microns.

In some implementations, the multilayer wiring stack comprises a metal carrier bonding layer, the capping layer comprises a metal capping bonding layer, in which bonding the capping layer to the multilayer wiring stack includes bonding the metal carrier bonding layer directly to the metal capping bonding layer.

In some implementations, bonding the capping layer to the multilayer wiring stack includes bonding a first dielectric layer of the multilayer wiring stack directly to the single crystal silicon dielectric layer of the capping layer.

In some implementations, the multilayer wiring stack includes a metal carrier bonding layer, and bonding the capping layer to the multilayer wiring stack includes bonding the metal carrier bonding layer directly to the single crystal silicon dielectric layer of the capping layer.

In some implementations, the capping layer includes a metal capping bonding layer, and bonding the capping layer to the multilayer wiring stack includes bonding the metal capping bonding layer directly to the a first dielectric layer of the multilayer wiring stack.

In some implementations, the circuit element includes a qubit readout resonator.

In some implementations, each of the wiring within the multilayer wiring stack, the electrically conductive via within the via hole, and the circuit element on the capping layer includes a superconductor. The superconductor may include at least one of aluminum, niobium, indium, niobium titanium nitride, or titanium nitride.

In some implementations, the layers of dielectric material within the multilayer wiring stack include vapor deposited oxide layers.

In some implementations, the multilayer wiring stack includes at least one additional circuit element formed within at least one of the wiring layers, in which the at least one additional circuit element includes a circuit element configured to operate in a microwave frequency between about 300 MHz and about 300 GHz.

In some implementations, the method further includes coupling a qubit chip comprising at least one qubit to the carrier chip that comprises the multilayer wiring stack bonded to the capping layer, such that there is a gap between the qubit chip and the carrier chip. Coupling the qubit chip including the at least one qubit to the carrier chip may include bump-bonding the qubit chip to the carrier chip.

Another innovative aspect of the subject matter described in this specification can be implemented in a carrier chip for distributing signals among circuit elements of a quantum computing device, the chip comprising: a multilayer wiring stack comprising alternating layers of dielectric material and wiring; a capping layer bonded to the multilayer wiring stack, the capping layer comprising a single crystal silicon dielectric layer; a via hole within the capping layer, wherein the via hole extends to a first wiring layer of the multilayer wiring stack; an electrically conductive via within the via hole and electrically coupled to the first wiring layer of the multilayer stack; and a circuit element on a surface of the capping layer, wherein the circuit element is directly electrically coupled to the electrically conductive via.

The foregoing and other implementations can each optionally include one or more of the following features, alone or in combination. For example, in some implementations, a thickness of the single crystal silicon dielectric layer between the multilayer wiring stack and the surface of the capping layer is between about 2 microns and about 20 microns.

In some implementations, the capping layer includes a first metal layer, the multilayer wiring stack includes a second metal layer, and the first metal layer is directly bonded to the second metal layer.

In some implementations, the capping layer includes a first metal layer, and the first metal layer is directly bonded to a dielectric layer of the multilayer wiring stack.

In some implementations, the multilayer wiring stack includes a first metal layer, and the first metal layer is directly bonded to the single crystal silicon layer.

In some implementations, the circuit element includes a qubit readout resonator.

In some implementations, each of the wiring layers within the multilayer wiring stack, the electrically conductive via within the via hole, and the circuit element on the capping layer includes a superconductor. The superconductor may include at least one of aluminum, indium, niobium, niobium titanium nitride, or titanium nitride.

In some implementations, the layers of dielectric material within the multilayer wiring stack include vapor deposited oxide layers.

In some implementations, the multilayer wiring stack includes at least one additional circuit element formed within at least one of the wiring layers, in which the at least one additional circuit element includes a circuit element configured to operate in a microwave frequency between about 300 MHz and about 300 GHz.

Another innovative aspect of the subject matter described in this specification can be implemented in a quantum computing system including: a multilayer wiring stack comprising alternating layers of dielectric material and wiring; a capping layer bonded to the multilayer wiring stack, the capping layer comprising a single crystal silicon dielectric layer; a via hole within the capping layer, wherein the via hole extends to a first wiring layer of the multilayer wiring stack; an electrically conductive via within the via hole and electrically coupled to the first wiring layer of the multilayer stack; a circuit element on a surface of the capping layer, wherein the circuit element is directly electrically coupled to the electrically conductive via; and a chip coupled to the capping layer, wherein the chip includes at least one qubit.

The foregoing and other implementations can each optionally include one or more of the following features, alone or in combination. For example, in some implementations, a thickness of the single crystal silicon dielectric layer between the multilayer wiring stack and the surface of the capping layer is between about 2 microns and about 20 microns.

In some implementations, the capping layer includes a first metal layer, the multilayer wiring stack includes a second metal layer, and the first metal layer is directly bonded to the second metal layer.

In some implementations, the capping layer includes a first metal layer, and the first metal layer is directly bonded to a dielectric layer of the multilayer wiring stack.

In some implementations, the multilayer wiring stack includes a first metal layer, and the first metal layer is directly bonded to the single crystal silicon layer.

In some implementations, the circuit element includes a qubit readout resonator, and the qubit readout resonator is aligned with a first qubit on the chip.

In some implementations, each of the wiring layers within the multilayer wiring stack, the electrically conductive via within the via hole, and the circuit element on the capping layer includes a superconductor. The superconductor may include at least one of aluminum, niobium, indium or titanium nitride.

In some implementations, the layers of dielectric material within the multilayer wiring stack include vapor deposited oxide layers.

In some implementations, the multilayer wiring stack includes at least one additional circuit element formed within at least one of the wiring layers, in which the at least one additional circuit element includes a circuit element configured to operate in a microwave frequency between about 300 MHz and about 300 GHz.

In some implementations, there is a gap between the chip and the capping layer.

In some implementations, the chip is bump-bonded to the capping layer.

The foregoing structure can offer several advantages. For instance, the multiple levels of signal lines within the multilayer wiring stack can be used to transfer signals among an array of qubits and/or other circuit elements on the chip to which the stack is bonded. This allows an increase in the number of circuits on the chip that can be coupled together, thus improving the scalability of the overall device. Additionally, because the readout resonator and/or other circuit elements requiring high coherence are formed on the relatively low loss capping layer, rather than the lossy dielectrics of the multilayer wiring stack, a high Q for the overall device can be achieved. Furthermore, there is no need to form deep via etches within the multilayer wiring stack to provide connections to the readout resonator or other circuit elements on the relatively low loss capping layer. Such deep via etches typically limit the number of layers that can be formed in the multilayer stack, and also take up space that can otherwise be used by signal lines.

The details of one or more implementations of the subject matter of this specification are set forth in the accompanying drawings and the description below. Other features, aspects, and advantages of the subject matter will become apparent from the description, the drawings, and the claims.

DETAILED DESCRIPTION

Figure 1A:
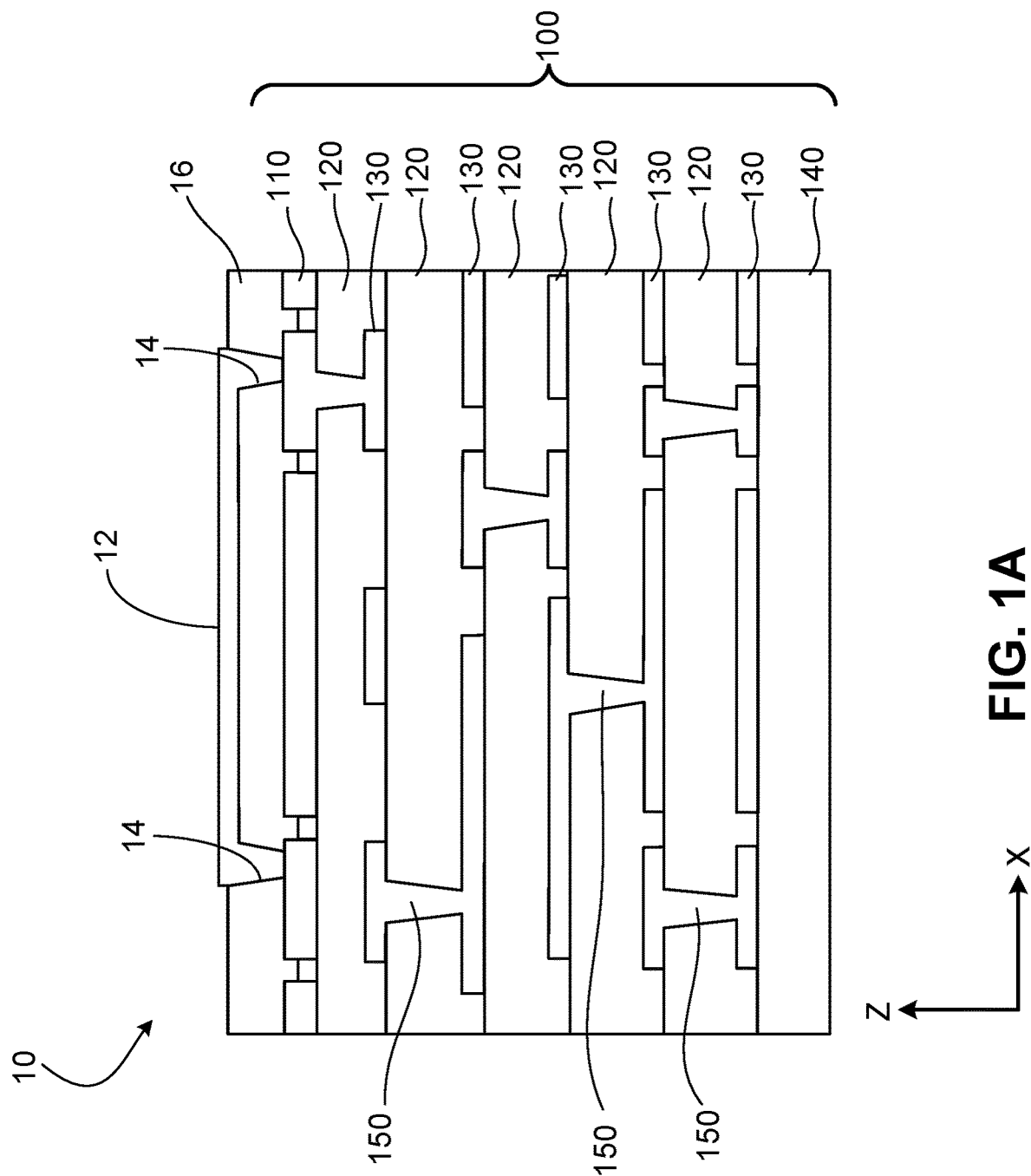
FIGS. 1A and 1B are diagrams illustrating an example of a carrier chip including a multilayer wiring stack and a capping layer.

The present disclosure relates to structures and techniques for facilitating signal distribution for quantum computing systems.

In developing quantum computing systems, devices with high quality factor, Q, and long qubit coherence time are desirable design parameters that potentially allow more complex computational systems to be fabricated. Interference from qubit control and readout circuits, as well as lossy dielectrics located near qubits, however, can have a significant adverse impact on both Q and coherence time, especially in solid-state quantum computing systems (e.g., due to inadvertent coupling to undesired frequencies). To reduce the reduction in Q and coherence time, some or all of the qubit control and qubit readout circuits may be located on a carrier chip that is separate and spaced apart from chip bearing the qubits. Furthermore, to expand the number of qubits to which the control and readout elements interface, multiple layers of wiring may be embedded within the carrier chip, which enhances the available pathways for signal distribution. Both the wiring layers and control/readout elements may be formed using semiconductor fabrication techniques, in which alternating layers of dielectric material and conductors are built up to form a multi-layer stack.

Integrating control and readout elements within a carrier chip that is separate from a qubit-bearing chip may involve design compromises to maintain respectable coherence. For instance, in some cases, the layer having the coherent readout resonator and qubit control elements is placed at the bottom of the multi-layer stack on a low-loss dielectric substrate (e.g., a monocrystalline silicon wafer). The readout and qubit control elements are accessed in such structures by performing a deep via-etch through the multi-layer stack and towards the end of the fabrication process. However, if the multi-layer stack is too thick, the quality of the deep via-etch may suffer. To maintain a higher quality etch, the number of layers within the stack may be limited, thus preventing the stack design from being arbitrarily scalable. Additionally, deep-via etches may take up space within the stack that can otherwise be used by signal lines.

Rather than forming the qubit control and readout elements at the bottom of a multilayer wiring stack, through which a deep-via etch is formed, the qubit control and readout elements may be instead fabricated on an exposed surface of a so-called "capping layer" that is bonded to the multilayer wiring stack. The capping layer itself is formed from a dielectric material having relatively low loss compared to the dielectric layers of the multilayer wiring stack. The qubit control and readout elements formed on the exposed surface of the capping layer may be electrically connected with one or more signal layers within the multilayer wiring stack through conductive vias formed within the capping layer. Furthermore, the carrier chip including the multilayer wiring stack and the bonded capping layer can be coupled, e.g., through bump-bonding, to the separate qubit-bearing chip. In such cases, the low-loss capping layer having the qubit control and readout elements may be located directly across from and facing the qubits of the qubit-bearing chip.

Figure 1B:
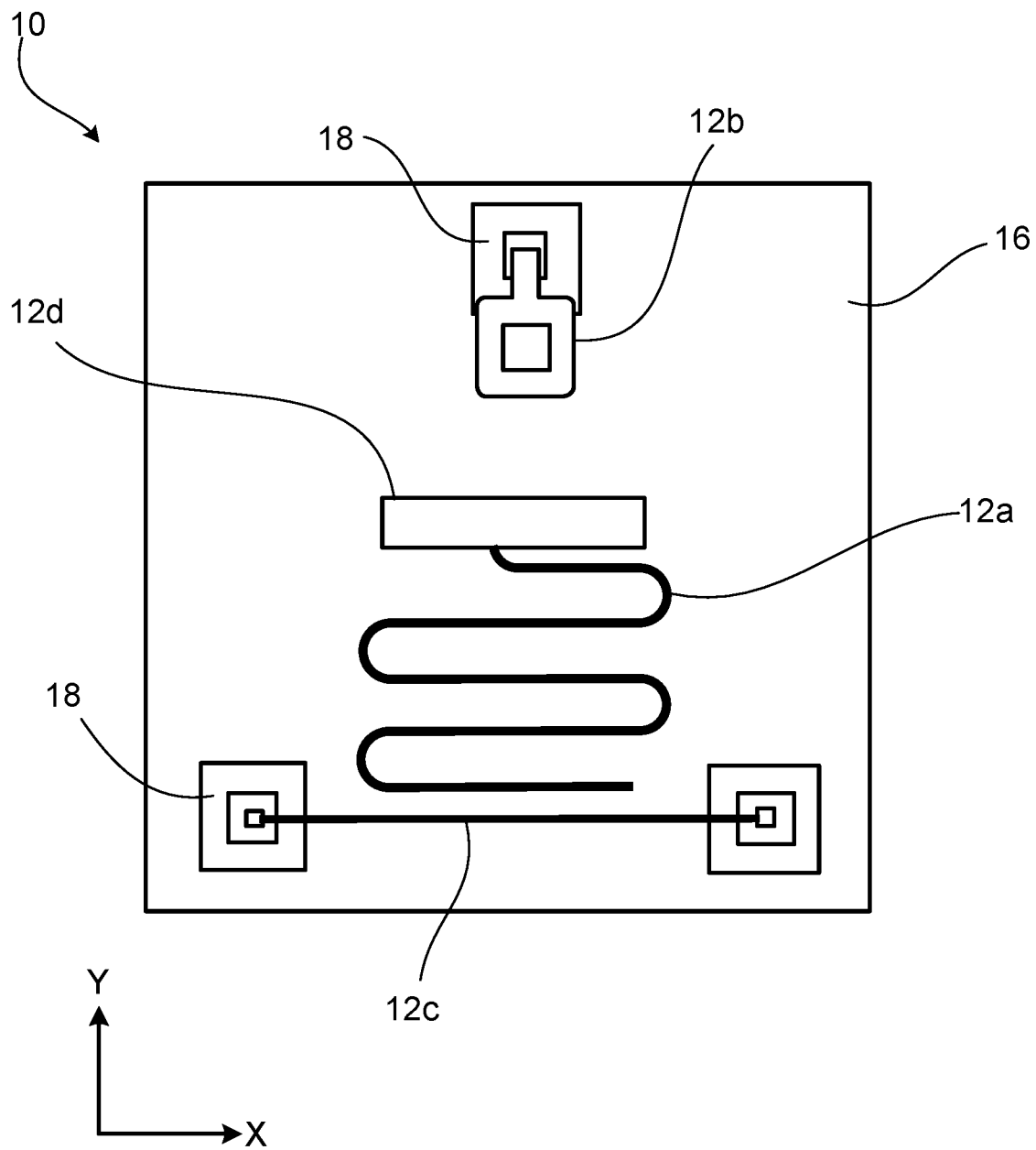

FIGS. 1A and 1B are diagrams illustrating an example of a carrier chip 10 including a multilayer wiring stack and a capping layer. FIG. 1A shows a cross-section view through a portion of the exemplary chip 10. FIG. 1B is a top view of the exemplary chip 10. In FIG. 1A, the chip 10 includes a multilayer wiring stack 100, a capping layer 18, and one or more circuit elements 12. In some implementations, the multilayer wiring stack 100 includes multiple layers includes alternating layers 110, 120, 130,140 of dielectric material and wiring. For example, the multilayer wiring stack 100 can include multiple wiring layers 130 that transfer to/from one or more circuit elements, provide power to one or more circuit elements, or to coupled one or more circuit elements to ground. Additionally, the multilayer wiring stack also include multiple dielectric layers 120, where each of the dielectric layers 120 may be used to provide physical support for a wiring layer or to separate adjacent wiring layers. The dielectric layers 120 may be formed from deposited or thermally grown dielectrics, such as tetraethoxysilane (TEOS), silicon dioxide, amorphous silicon, or silicon nitride, among other dielectric material. The thickness of each dielectric layer 120 may vary, e.g., between several nanometers to several hundreds of nanometers, and even several tens of microns. In some implementations, the multilayer wiring stack 100 may include a substrate layer 140 on which the dielectric and wiring layers are formed. The substrate 140 may include, e.g., a silicon wafer. In some cases, the substrate 140 is removed prior to finalizing the quantum computing device of which the carrier chip 10 will be a component.

The multilayer wiring stack 100 also may include conductive vias, such as conductive vias 150, through which adjacent wiring layers can be electrically coupled. For example, the conductive vias 150 can include one or more electrically conductive portions formed in openings of the dielectric layers 120 between adjacent wiring layers 130 to transfer one or more signals, to provide power, or to couple one or more circuit elements to ground. The conductive vias 150 and the wiring layers 130 can include any suitable conductor, such as superconductor material including aluminum, titanium nitride, niobium titanium, niobium titanium nitride, ruthenium, molybdenum, or niobium, among others. The wiring layers 130 may be formed as thin films, in which the thickness varies, e.g., from several nanometers to several hundreds of nanometers and even several microns in some cases.

The multilayer wiring layer 100 may be used to provide signal distribution among one or more of the circuit elements 12 formed on capping layer 16. For instance, the one or more circuit elements 12 may be electrically coupled to one or more wiring layers of the multilayer wiring stack 100 through conductive vias 14 formed within the capping layer 16. Similar to wiring layers 130 and conductive vias 150, the conductive vias 14 may be formed from an electrically conductive material such as a superconductor including, e.g., aluminum, titanium nitride, or niobium, among other materials.

The one or more circuit elements 12 are formed on the capping layer 16. To maintain a high quality factor in the one or more circuit elements 12, the capping layer 16 is formed from a low-loss dielectric material, such as mono-crystalline silicon. The dielectric material of the capping layer 16 is considered to have substantially lower loss relative to the dielectrics that form the multilayer wiring stack 100. For instance, monocrystalline silicon may be understood to have an intrinsic loss tangent of between about $1\text{-}10\times10^{-6}$ at microwave frequencies typically applied for superconducting qubits (e.g., between about 300 MHz and about 300 GHz) and at temperatures less than about 100 mK, whereas deposited or thermally grown dielectrics, such as TEOS or $SiO_2$, may have loss tangents two to three orders of magnitude larger at the same microwave frequencies and temperatures. Accordingly, by using a high quality, low loss capping layer on which the circuit elements 12 are formed, the circuit elements 12 e.g., a readout resonator, may exhibit relatively high Q. For example, the circuit elements 12 on the capping layer may exhibit Qs up to about $6\times10^5$, up to about $7\times10^5$, up to about $8\times10^5$, up to about $9\times10^5$, up to about $1\times10^6$, up to about $1.1\times10^6$, up to about $1.3\times10^6$, up to about $1.4\times10^6$, up to about $1.5\times10^6$, up to about $1.6\times10^6$, up to about $1.7\times10^6$, up to about $1.8\times10^6$, up to about $1.9 \times 10^6$, or up to about $2 \times 10^6$, at microwave frequencies between about 300 MHz and about 300 GHz. In contrast, for circuit elements formed on a low loss dielectric such as TEOS, the maximum Q may be no more than about $1.5 \times 10^5$. In some implementations, the thickness of the capping layer 16, i.e., the distance between the multilayer wiring stack 100 and the upper exposed surface of the capping layer 16, is, e.g., between about 2 microns and about 20 microns.

In some implementations, the capping layer 16 may be joined to the multilayer wiring stack 100 through a bonding layer 110. The bonding layer 110 may be formed from an electrically conductive material, such as a superconductor, and may double as a wiring layer of the multilayer wiring stack. For example, the bonding layer 110 may be formed from aluminum, titanium nitride, niobium, or other conductor. As with the wiring layers already described, the bonding layer 110 may have a thickness between several nanometers and several hundred nanometers, up to even several microns in some cases.

As explained herein, one or more circuit elements 12 can be formed on a surface of the capping layer 16. The one or more circuit elements 12 may include various different qubit control elements, qubit readout elements, and/or other circuit elements. For example, referring to FIG. 1B, the one or more circuit elements 12 may include a qubit readout resonator 12a, such as a co-planar waveguide resonator, a stripline resonator, or a microstrip resonator, among other resonator types. Alternatively, or in addition, the one or more circuit elements may include a filter 12b, such as bandpass filters (e.g., Purcell filters), low-pass filters, or high pass filters. Other examples of circuit elements include wiring lines 12c, as well as qubit bias and qubit control elements. In some implementations, the circuit elements include the capacitive coupling element 12d that mediates the interaction between a readout resonator, e.g., the qubit readout resonator 12a, and a qubit.

As explained herein, in some cases, vias (shown as openings 18 in FIG. 1B) may be formed in the capping layer 16 and filled with a conductor (e.g., a superconductor) to allow electrical contact to be made between a circuit element 12 on the exposed surface of the capping layer 16 and a wiring layer beneath the capping layer 16. The type and number of circuit elements 12 are not limited to those shown in FIG. 1B. The one or more circuit elements 12 may be formed from an electrically conductive thin film, such as a superconductor thin film including, e.g., aluminum, titanium nitride, or niobium, among other types of conductors. The thickness of the thin films that form the circuit elements 12 may be, e.g., between several nanometers and several hundred nanometers, and even several microns in some cases.

The carrier chip 10 including the multilayer wiring stack and bonded capping layer 16 having the one or more circuit elements 12 can be coupled, e.g., through bump-bonding, to a separate chip that includes quantum computing circuit elements, such as qubits. In particular, the carrier chip 10 may be bonded so the low-loss capping layer is located directly across from the chip having the quantum computing circuit elements.

Figure 2A:
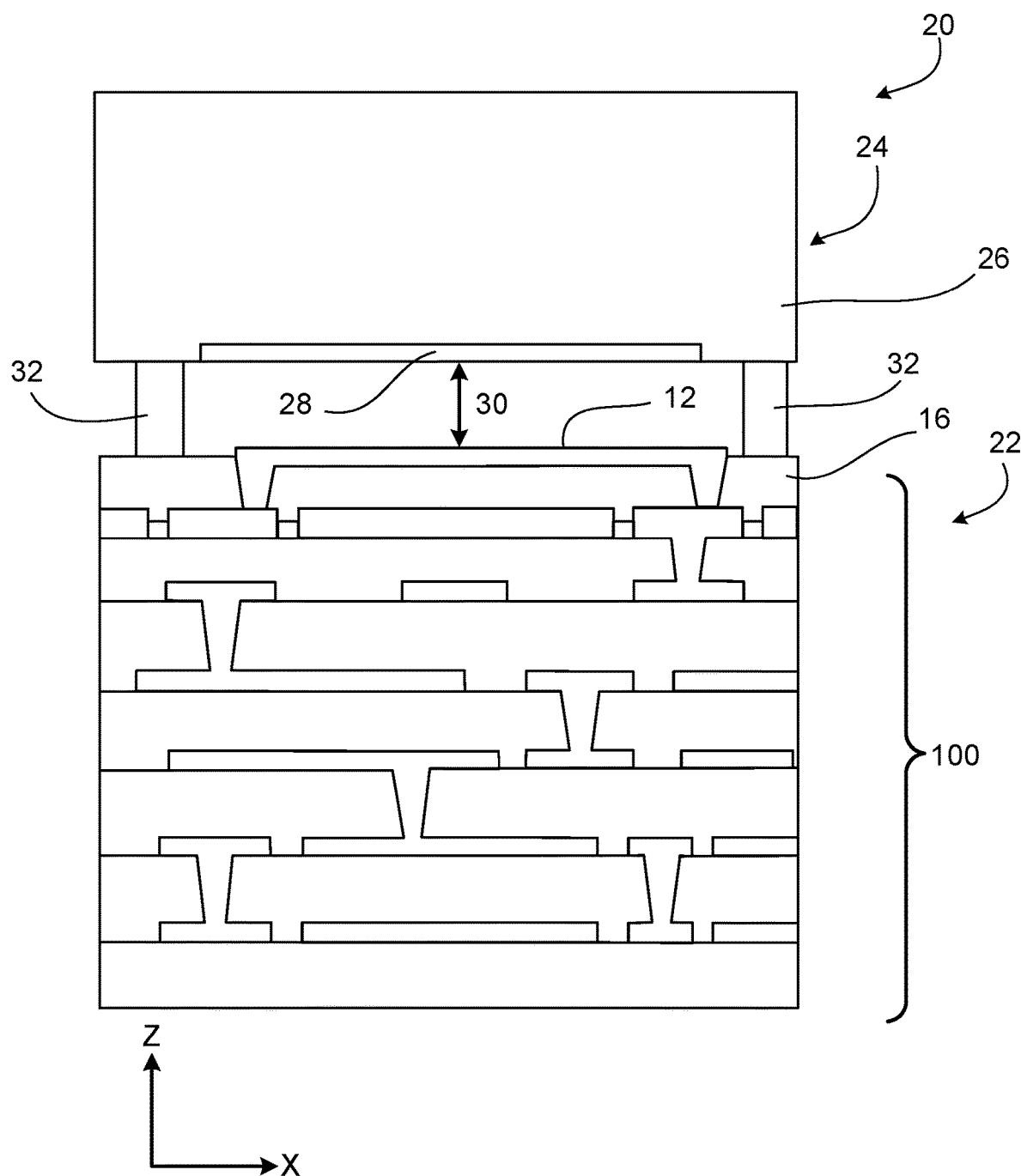
FIGS. 2A and 2B are diagrams illustrating an example of a quantum computing device.
Figure 2B:
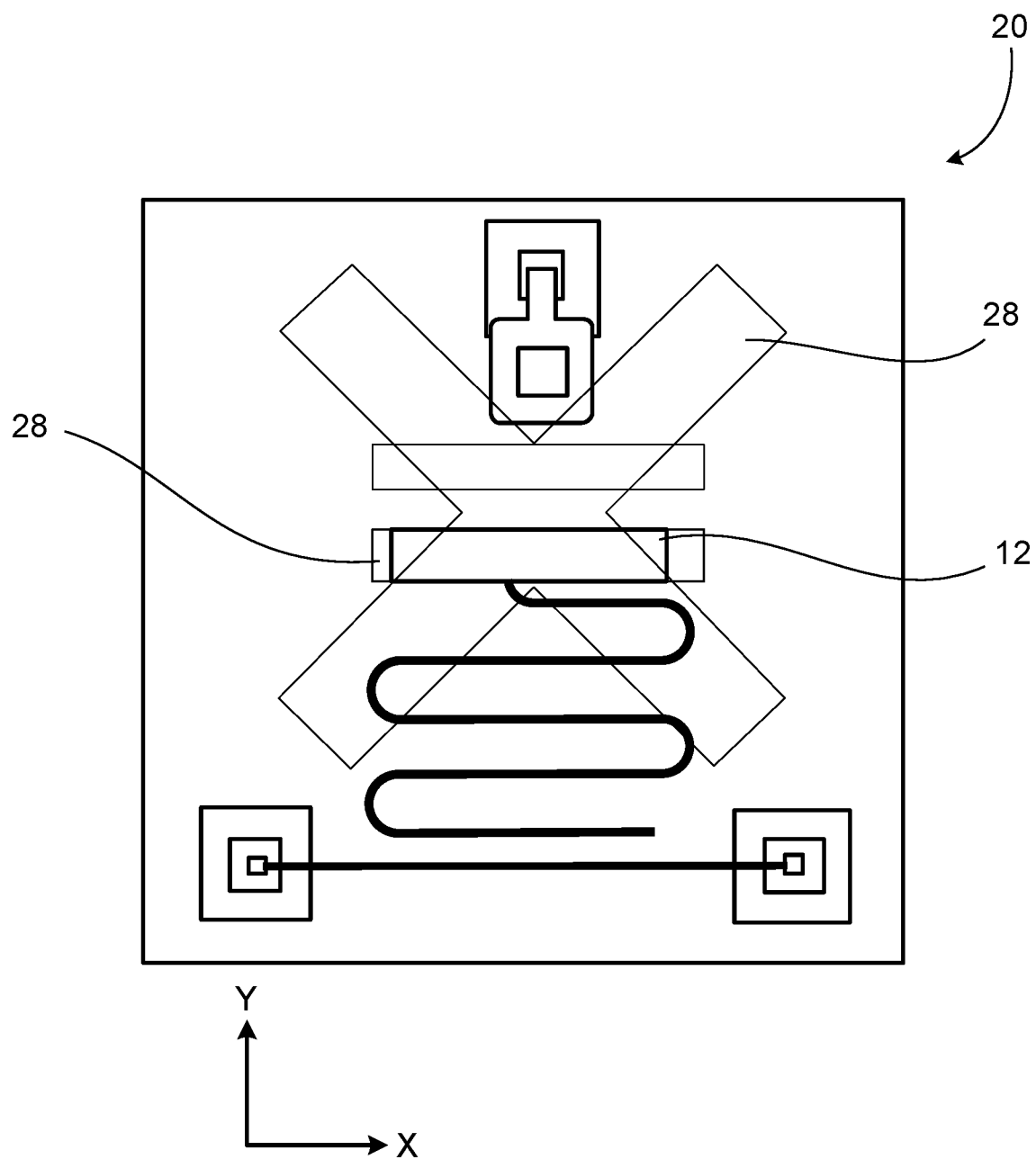

FIGS. 2A and 2B are diagrams illustrating an exemplary quantum computing device 20 that includes a carrier chip 22, such as the carrier chip 10 described herein with respect to FIGS. 1A-1B, coupled to a second chip 24 (also referred to herein as a qubit chip) containing quantum computing circuit elements, such as qubits. FIG. 2A is a schematic illustrating a cross-sectional view of the quantum computing device 20. FIG. 2B is a schematic illustrating a top view of the quantum computing device 20, in which certain features at different heights through the device 20 are made visible. As with the carrier chip 10, the carrier chip 22 includes a multilayer wiring stack 100, a capping layer 16, and one or more circuit elements 12. The features of the carrier chip 22 have been described above with respect to FIGS. 1A and 1B and will not be repeated here.

The qubit chip 24 includes a dielectric substrate 26 formed from a low loss dielectric, such as monocrystalline silicon or sapphire. One or more quantum circuit elements 28 may be formed on a surface of the substrate 26. For example, the quantum circuit elements 28 may include a superconducting qubit, such as an Xmon qubit, a Gmon qubit, a fluxmon qubit, a transmon qubit, or a charge qubit, among other types of qubits. The quantum circuit elements 28 may be formed, at least in part, from superconductor thin film materials including, e.g., aluminum, niobium, or titanium nitride, among others. The thickness of the thin films used to form the quantum circuit elements may be between several nanometers and several hundreds of nanometers, and even several microns in some cases. Other circuit elements, including other types of quantum circuit elements other than qubits, may also be included on the qubit chip 24. For example, in some cases, the qubit chip 24 may also include ground planes. In some implementations, qubit control and qubit readout elements may also be included on the qubit chip 24 even though such elements may be formed on the carrier chip 22.

The qubit chip 24 is coupled to the carrier chip 22 such that there is a gap between the qubit chip 24 and the carrier chip 22. The height 30 of the gap may be between about 1 micron to about 20 microns, including, e.g., between about 5 to about 10 microns. The height 30 may be set by the desired level of electromagnetic coupling between one or more quantum circuit elements 28 on the qubit chip 24 and the one or more circuit elements 12 on the carrier chip 22. For instance, the circuit element 12 on the carrier chip 22 may include a qubit readout resonator. The readout resonator operates by electromagnetically coupling with a corresponding qubit on the qubit chip 24. However, it may also be useful to keep control elements on the carrier chip 22 sufficiently separated from the qubit chip 24 so that undesired electromagnetic interference from the control elements do not adversely affect the state of the qubits on the qubit chip 24 (e.g., by inducing qubit decoherence). Thus, the desired height 30 may be chosen such that sufficient desired coupling between circuit elements on either chip is achieved, without introducing unwanted interference.

Coupling between the qubit chip 24 and the carrier chip 22 may be achieved using bump bonds 32. The bump bonds 32 provide a physical connection that secures the qubit chip 24 to the carrier chip 22, while also maintaining the gap separation between the qubit chip 24 and the carrier chip 22. In some implementations, the bump bonds 32 are provided only for fixing the qubit chip 24 to the carrier chip 22. In other implementations, the bump bonds 32 also provide an electrical connection between circuit elements on the qubit chip 24 and circuit elements on the carrier chip 22. For instance, the bump bonds 32 may connect a circuit element on the qubit chip 24 to a ground plane on the carrier chip 22. Bump bonds 32 may be formed from superconductor material, such as indium, though other materials may be used instead.

In some implementations, the bump bonds 32 are electrically connected through and formed on interconnect pads on one or both of the qubit chip 24 and the carrier chip 22. The interconnect pads may be formed from a superconductor material to reduce decoherence and energy loss. For instance, the interconnect pads may be formed of aluminum. In some implementations, a superconductor barrier layer, such as titanium nitride, is formed between the bump bonds 32 and the interconnect pads to provide an electrically conducting barrier that blocks diffusion of the bump bond material into the interconnecting pad and/or vice-versa. The thickness of the interconnect pads and the barrier layer may be a few nanometers to several tens of nanometers to several hundred nanometers.

In some implementations, the one or more circuit elements 12 formed on the capping layer 16 of the carrier chip 22 can be aligned with the one or more quantum circuit elements 28 formed on the qubit chip 24. For instance, in some cases, it may be useful to align a qubit readout resonator on the carrier chip 22 with a corresponding qubit on the qubit chip 24 to allow sufficient electromagnetic coupling (e.g., inductively and/or capacitively) between the readout resonator and the qubit during operation of the quantum computing device 20, thus enabling the state of the qubit to be measured. An example of this configuration is shown in FIGS. 2A and 2B. For instance, as shown in the top view of FIG. 2B, the quantum circuit element 12 is an Xmon type qubit, in which a portion of the Xmon type qubit overlaps in the X and Y directions with a portion of a circuit element 12 corresponding to a qubit readout resonator. The overlap along the X-direction between qubit 28 and resonator 12 also is shown in the cross-section view of FIG. 2A. The amount of overlap required between the circuit element from the carrier chip 22 and the qubit chip 24 may depend on various factors including, e.g., the level of electromagnetic coupling between the circuit elements, the materials used and the gap separation between the carrier chip 22 and the qubit chip 24. In some implementations, multiple circuit elements on the carrier chip 22 may be aligned with multiple quantum circuit elements, respectively, on the qubit chip 24 so that, e.g., each of the multiple carrier chip circuit elements can couple to a corresponding quantum circuit element of the qubit chip 24.

The configuration of device 20 shown in FIGS. 2A-2B can offer several advantages. For instance, the multiple levels of wiring lines within the multilayer wiring stack can be used to provide signal distribution among the various qubit control and qubit readout elements formed on the carrier chip 22. Alternatively, or in addition, the multiple levels of wiring lines may provide signal distribution among an array of qubits and/or other quantum circuit elements on the qubit chip 24 to which the carrier chip 22 is bonded. Accordingly, the multilayer wiring stack effectively allows an increase in the number of quantum circuit elements on the qubit chip that can be controlled, and ultimately used as part of a computation during operation of a quantum computing device, improving the scalability of the overall device. Additionally, because the qubit readout resonator, qubit control elements and/or other circuit elements requiring high coherence are formed on the relatively low loss capping layer 16, rather than the lossy dielectrics of the multilayer wiring stack 100, a high Q for those circuit elements, and thus overall for the device, can be achieved. Furthermore, there is no need to form deep via etches within the multilayer wiring stack 100 to provide connections to the qubit readout resonator or other circuit elements on the relatively low loss capping layer, thus freeing up space within the multilayer wiring stack 100 for other uses such as routing wiring.

FIGS. 3A-3F are diagrams illustrating an exemplary process to manufacture a quantum computing device, such as the quantum computing device 20 described with reference to FIGS. 2A and 2B.

Figure 3A:
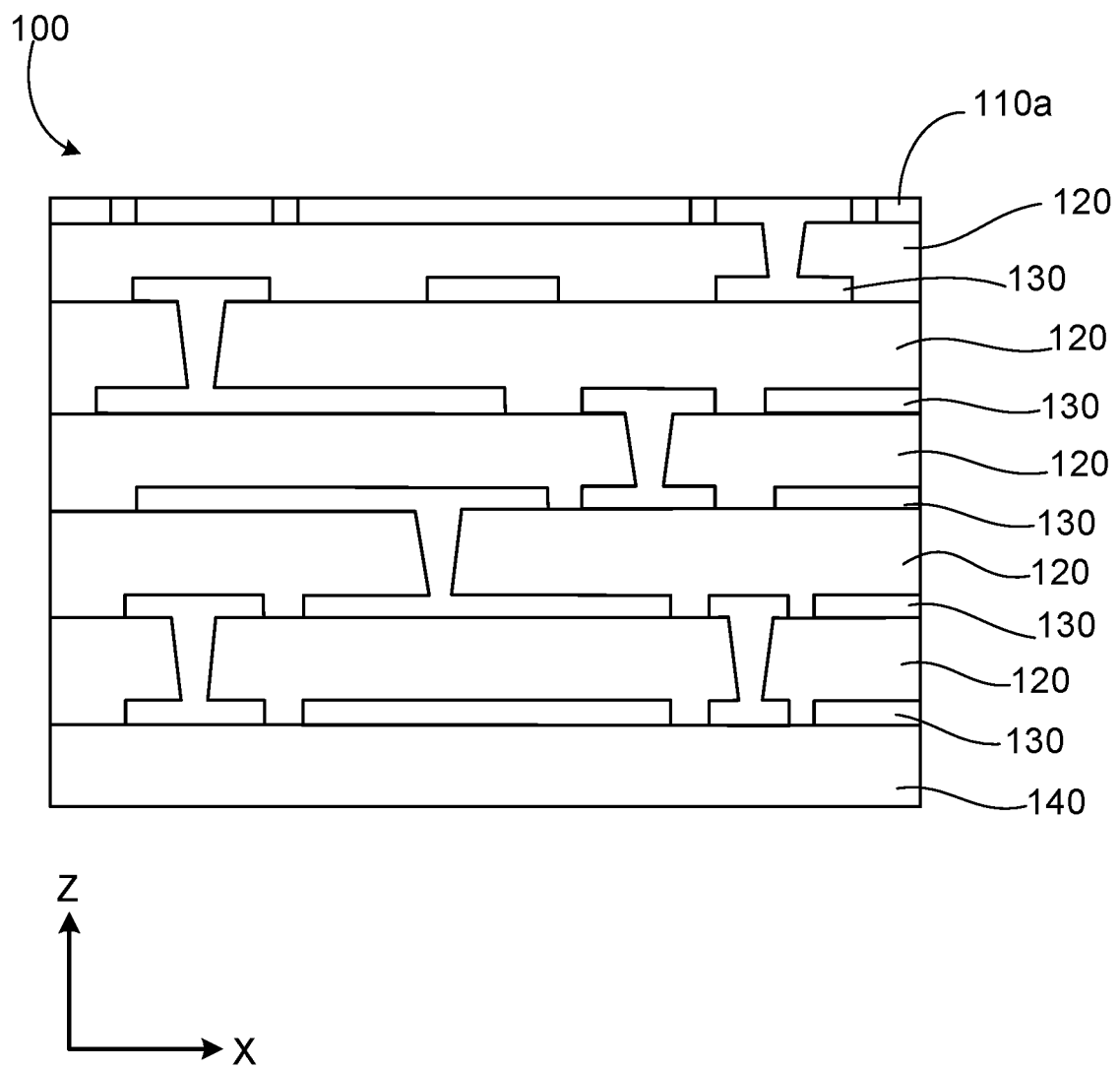
FIGS. 3A-3F are diagrams illustrating an example process to manufacture a quantum computing device.

First, as shown in FIG. 3A, a multilayer wiring stack 100 is provided. The multilayer wiring stack 100 includes alternating layers of dielectric material 120 and wiring 130. Different layers of wiring 130 may be electrically connected together through conductive vias formed within the dielectric layers 120. Details regarding the dielectric and wiring layers, as well as conductive vias, are described herein with respect to FIGS. 1-2 and are not repeated here. The multilayer wiring stack 100 may be built using semiconductor fabrication processes. For instance, in some cases, a substrate layer 140 if first provided, in which the substrate layer 140 includes a wafer, such as monocrystalline silicon. Using material deposition techniques (e.g., physical vapor deposition), the multiple layers of dielectric material 120 and wiring 130, including the via contacts, are formed on the surface of the substrate layer 140. The individual dielectric and wiring layers may be patterned using complementary metal oxide semiconductor (CMOS) patterning techniques including lithography, lift-off, and etching. For instance, for each layer, a patterned photoresist layer may be formed on a surface of the layer using lithography, after which openings in the photoresist layer are exposed to an etchant (e.g., a wet or dry etchant) to remove the underlying material in the exposed region. The patterning of the individual layers may be used to provide signal distribution pathways throughout the multilayer wiring stack 100. In some cases, after forming the multilayer wiring stack 100, the substrate layer 140 is partially or wholly removed using, e.g., a backside etch.

In some cases, a first bond layer 110a is formed on the uppermost surface of the multilayer wiring stack 100 (e.g., at the side of the device opposite to the side where the substrate layer 140 is formed). The first bond layer 110a may be formed from metal such as a metal superconductor (e.g., aluminum among others). As with the underlying wiring layers 130, the top layer 110a also may be deposited and patterned using CMOS fabrication techniques. The first bond layer 110a may provide an electrical connection to underlying wiring layers through conductive vias that connect to the first bond layer 110a.

Figure 3B:
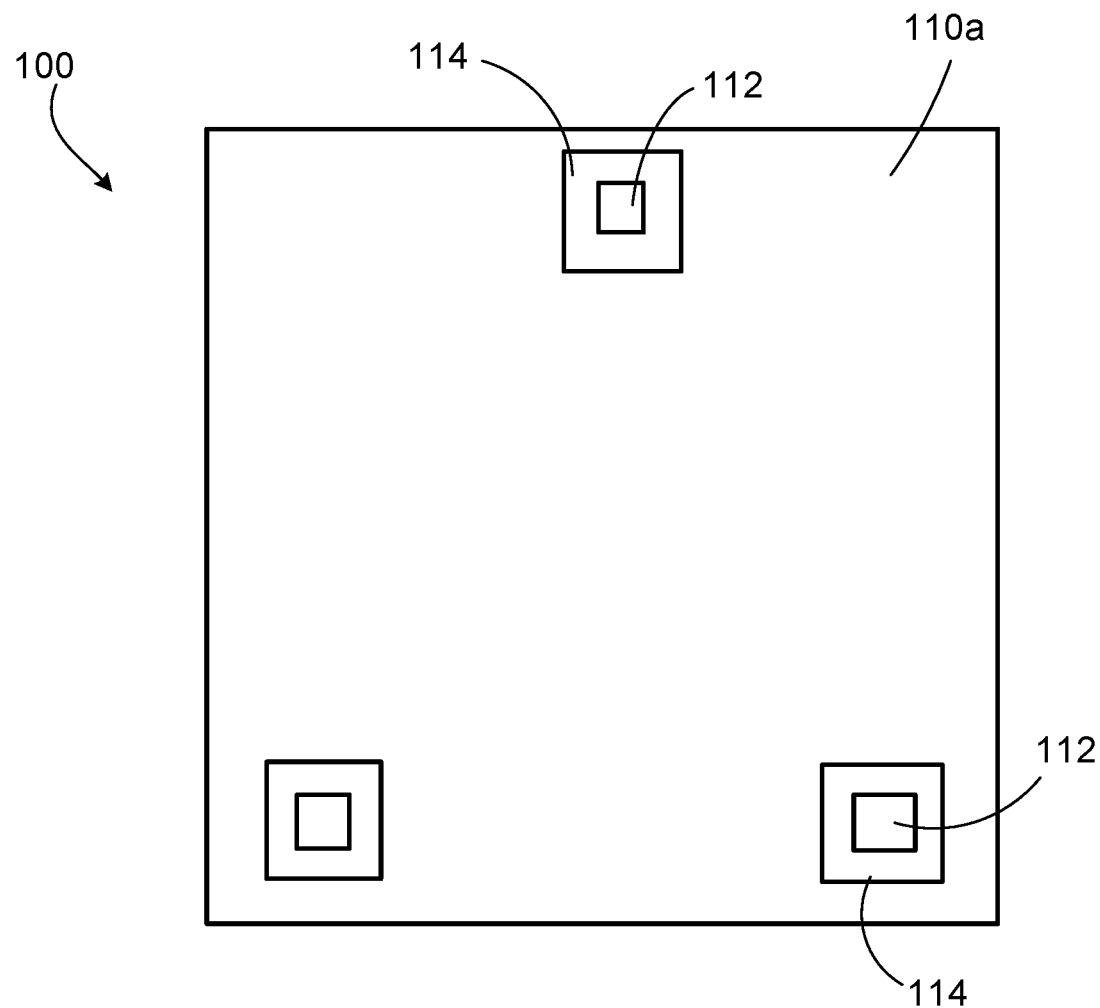
Figure 3C:
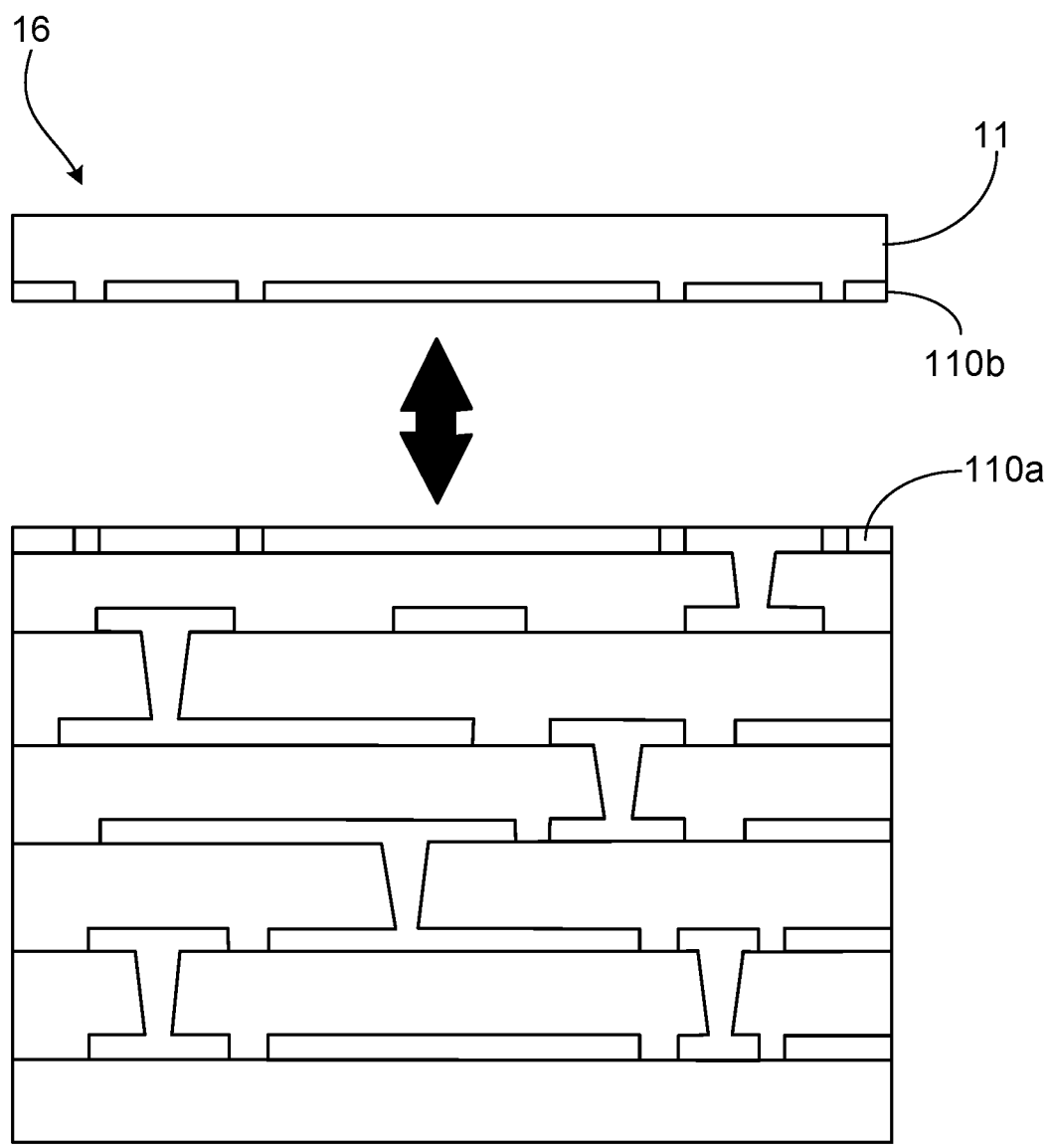

FIG. 3B illustrates a top view of the multilayer wiring stack 100 illustrated in FIG. 3A. As shown in FIG. 3B, the first bond layer 110a is patterned to define contact portions 112. The contact portions 112 may be electrically isolated from the rest of the bond layer 110a by forming openings 114 within the bond layer 110a that surround the contact portions 112. For instance, the first bond layer 110a may be etched to expose an underlying dielectric layer in the regions 114. In this way, the contact portions 112 may be used to provide electrical connections to contacts to be formed within the capping layer, whereas the rest of the first bond layer 110a, which is electrically isolated from the contact portions 112, may be used to bond to the capping layer.

After forming the multilayer wiring stack 100, a capping layer 16 is bonded to the multilayer wiring stack 100. The capping layer 16 may include, for example, a low-loss dielectric substrate 11 and a second bond layer 110b. The low-loss dielectric substrate 11 may include, e.g., monocrystalline silicon. The low-loss dielectric substrate 11 may be formed using a silicon-on-insulator (SOI) process, where the highly crystalline silicon layer 11 is formed on an electrical insulator surface (e.g., silicon dioxide or sapphire) of handle wafer. The handle wafer and insulator of the SOI wafer are not shown in FIG. 3C. The handle wafer and insulator may be removed from the substrate 11 after bonding the capping layer 16 to the multilayer wiring stack 100, leaving the just the low loss dielectric layer 11. The low loss dielectric layer 11 may have a thickness between about 2 microns and about 20 microns. The second bond layer 110b may be formed from a metal including a metal superconductor layer. For instance, a layer of superconductor material such as aluminum may be deposited on the cleaned surface of the monocrystalline silicon layer 11.

Figure 3D:
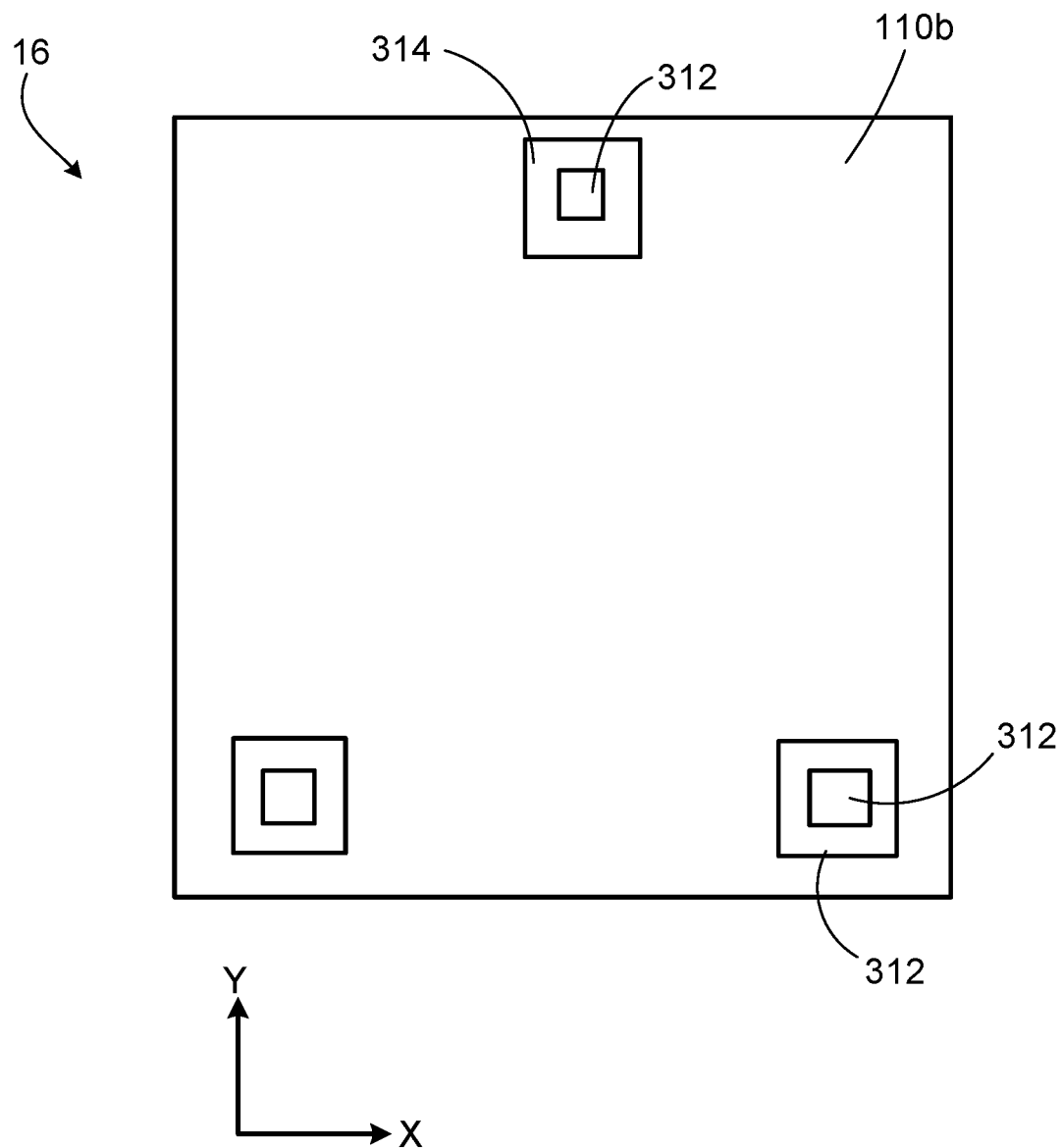

In some implementations, the second bond layer 110b may be modified to have a pattern that corresponds to the pattern formed in the first bond layer 110a of the multilayer wiring stack 100. For example, FIG. 3D illustrates a plan view of the surface of second bond layer 110b that will bond to first bond layer 110a. As shown in FIG. 3D, the second bond layer 110b is patterned to define contact portions 312. The contact portions 312 may be electrically isolated from the rest of the bond layer 110b by forming openings 314 within the bond layer 110b that surround the contact portions 312. For instance, the second bond layer 110b may be etched to expose the underlying low loss dielectric substrate 11 in the regions 314. In this way, the contact portions 312 may be used to provide electrical connections to contacts 112 defined in the first bond layer 110a within the multilayer wiring stack 100, whereas the rest of the second bond layer 110b, which is electrically isolated from the contact portions 312, may be used to bond to the first bond layer 110a.

To enhance the bonding of the first bond layer 110a to the second bond layer 110b, the bonding surfaces of the first bond layer 110a and/or the second bond layer 110b may be exposed to an ion milling process. The ion milling process may be used to prepare the surfaces and improve adhesion between the bonding layers. In some implementations, the ion milling process can be performed in regions away from a qubit readout resonator. In some implementations, the ion milling process can be performed in regions facing a qubit readout resonator. Where the ion milling process is performed in the regions facing the qubit readout resonator, the qubit readout resonator can include a metal such that the qubit readout resonator can be shielded by this metal from damage caused by the ion milling process.

Ion milling includes directing ions (e.g., argon ions) at the surface of the bond layers at an angle and sputtering material from the surface. For example, in some implementations, ion milling can be performed in an ion milling machine by flowing Ar gas at about 3.6 sccm at a pressure of $3.7*10^{-4}$ mbar, without heat being added (e.g., under an ambient temperature of a manufacturing facility in which the device is being fabricated). It is believed that the ion milling activates the surface structure of the bond layer to provide improved bonding properties. That is, by removing the native oxide and/or contaminants from the surface of the superconductor using an ion mill, a room temperature or near room temperature wafer bonding can be achieved (e.g., at about an ambient temperature of the manufacturing facility in which the device is fabricated). Because the ion milling process only removes atoms from the surface of the bond layers, however, the ion milling does not substantially increase the energy loss associated with the surfaces of the bond layer and is unlikely to contribute to a reduction in the quality factor of circuit elements formed on the capping layer.

Following the ion mill activation of the bond layers 110a, 110b, the multilayer wiring stack 100 and the capping layer 16 are bonded together to form the carrier chip 24. Bonding is performed under a vacuum. The range of pressure for the vacuum can be between approximately $10^{-7}$ Torr to approximately $10^{-9}$ Torr. Bonding may require relatively little pressure. For instance, a few pounds of pressure (for a wafer of approximately 3 inch diameter, e.g., about a few kPa) may be sufficient to obtain an adequate bond between the wafers as in a cold-welding process. In some implementations, however, greater pressure may be applied. The bonding also can be performed at an ambient temperature of the manufacturing facility in which the device is constructed (e.g., in the range of approximately 18° C. and approximately 30° C.). In some implementations, additional heat can be applied during the bonding process if desired. However, the temperature should preferably be kept below approximately 150° C., which is the typical temperature at which the hillocks and/or voids begin to form and diffusion across interfaces increases sufficiently enough to generate noticeable losses at the interfaces between the dielectric and superconductor and between the superconductors.

The bonding process described above is a metal-to-metal bonding process. However, in some implementations, a metal-to-dielectric bonding process may be performed instead to bond the multilayer wiring stack 100 to the capping layer 16. For instance, in some cases, the first bond layer 110a is not formed in the multilayer wiring stack 100 leaving the topmost layer to be a dielectric layer 120 of stack 100. The topmost dielectric layer then may be bonded directly to the metal layer 110b on the capping layer. Alternatively, in some cases, the second bond layer 110b is not formed, such that the high quality dielectric substrate 11 of the capping layer is directly bonded to the first bond layer 110a of the multilayer wiring stack 100. In some implementations, both the first and second bond layers 110a, 110b are not used and a direct dielectric-to-dielectric bond is performed between an uppermost dielectric layer 120 of the stack 100 and the low loss dielectric substrate 11 of the capping layer 16. In some implementations, a metal-to-dielectric bonding process can be performed. In these implementations, various treatments can be applied to the surfaces of the bond layers. For example, the ion milling process described above can be performed on the surfaces of the bond layers. As another example, the surfaces of the bond layers can be bonded without applying the ion milling process. As another example, hydrofluoric acid dipping can be performed to the dielectric side of the surfaces.

Figure 3E:
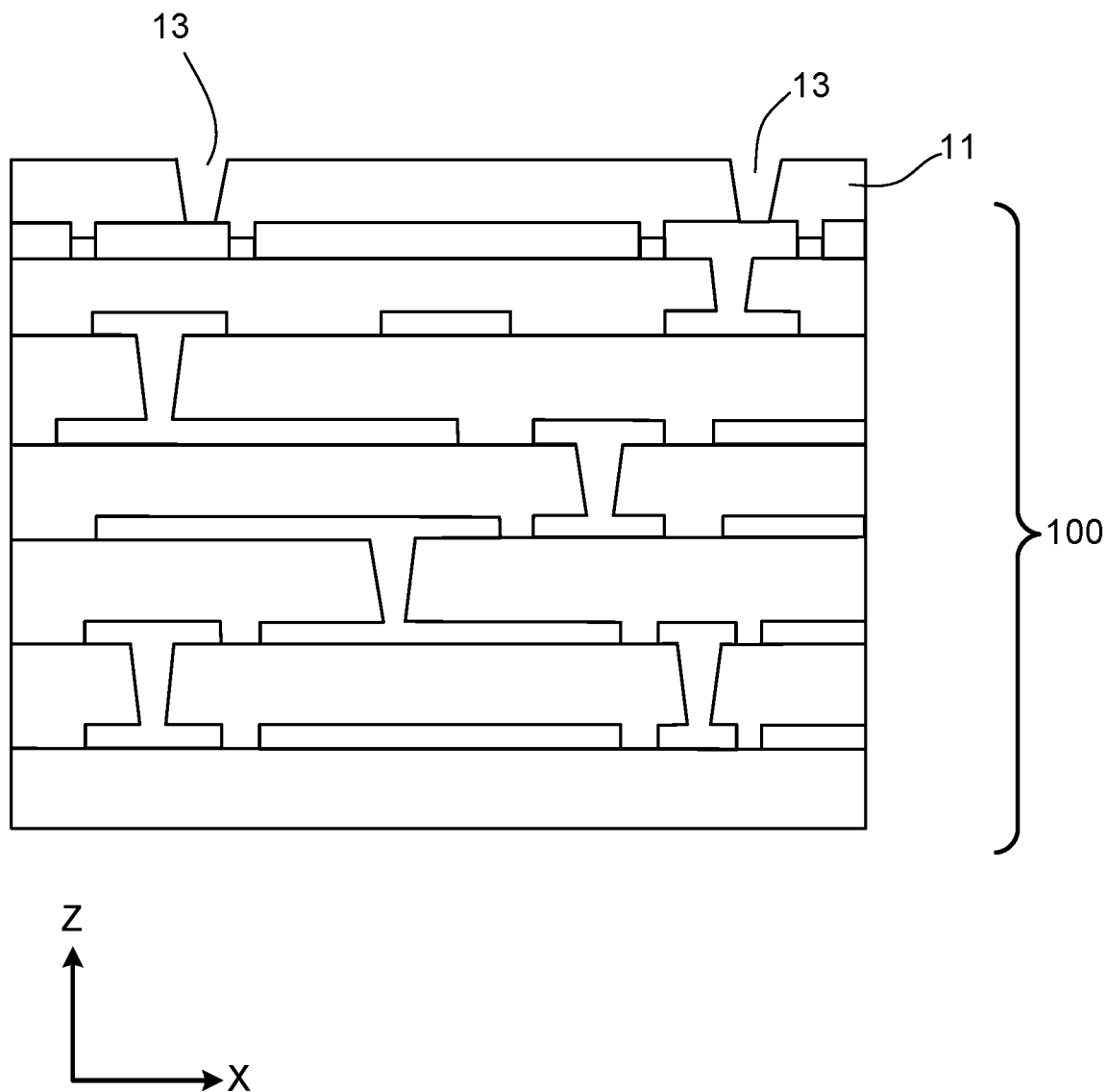

In some implementations, after bonding the capping layer 16 to the multilayer wiring structure 100, the buried oxide layer and a bulk handling layer of the SOI wafer may be removed to expose a surface of the capping layer. After removing the oxide and handling layer, openings 13 are formed within the low loss dielectric layer 11 of the capping layer 16, as shown in FIG. 3E. The openings 13 are formed to provide vias through which electrical connections may be made to the underlying wiring layers of the stack 100. The openings 13 may be formed, e.g., by etching predefined regions within the substrate 11 such that the openings 13 extend to a top most wiring layer of the stack 100. The top most wiring layer can include, e.g., the second bond layer 110b, the first bond layer 110a or some other wiring layer.

Figure 3F:
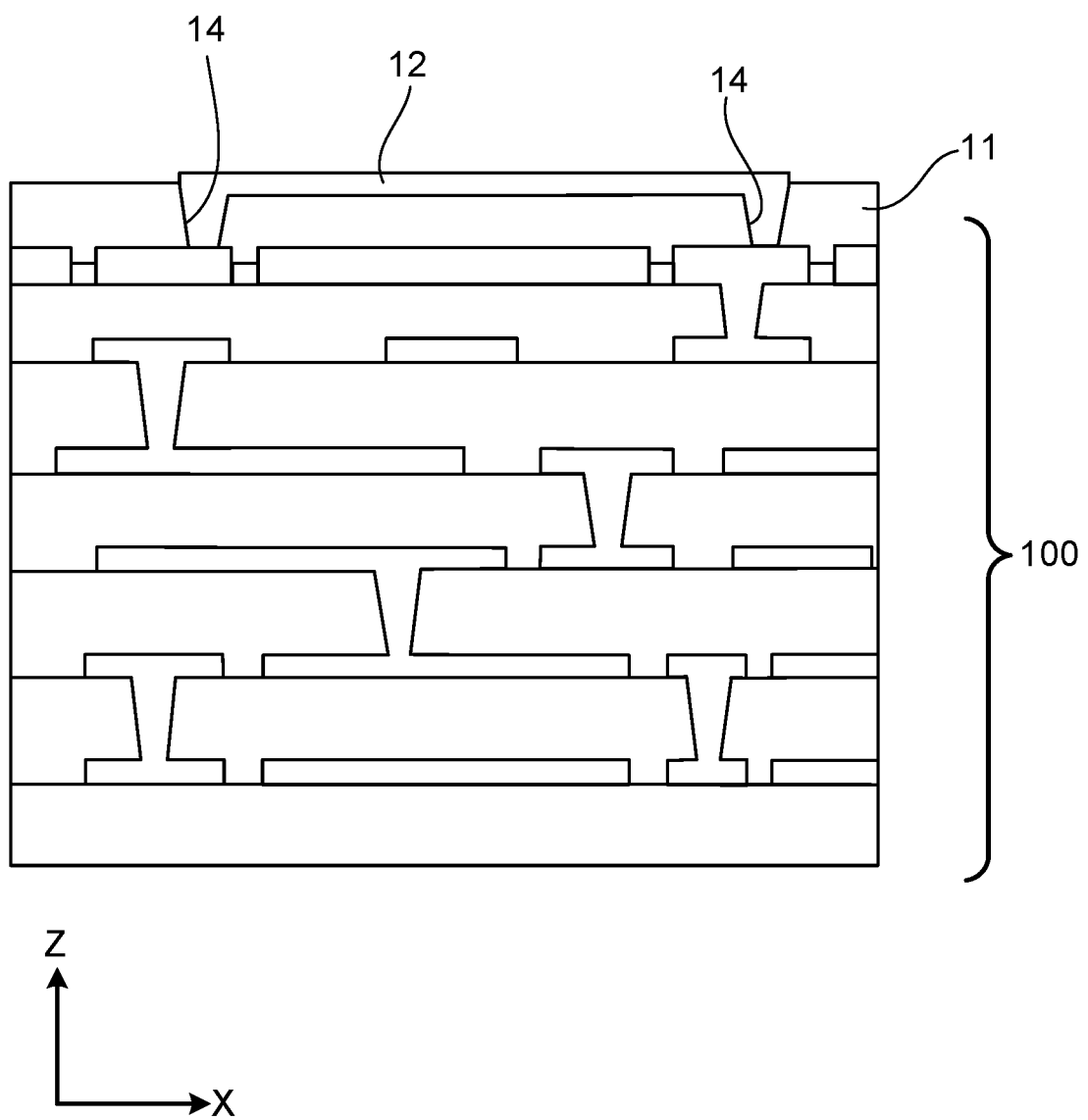

After forming the openings 13 within the substrate 11, an electrical conductor layer is formed and patterned on the surface of substrate 11, as shown in FIG. 3F. The electrical conductor layer may include a superconductor material, such as, e.g., aluminum, niobium, titanium nitride, among other superconductor materials. The superconductor may be deposited within openings 13 to form via contacts 14 that provide an electrical connection to underlying wiring layers of the stack 100. The superconductor layer may be patterned to form circuit elements, such as qubit control and readout elements for, e.g., biasing, operating and measuring qubits on the qubit chip. The circuit elements 12 on the surface of the capping layer are directly electrically coupled to the electrically conductive vias 14. The circuit element 12 may be configured to operate in a microwave frequency between about 300 MHz and about 300 GHz, and may include, for example, co-planar waveguides, frequency filters, qubit readout resonators, qubit bias control elements and qubit frequency control elements, among other types of circuit elements.

After forming the carrier chip 24 as shown in FIG. 3F the carrier chip 24 then is coupled to a qubit chip that includes one or more quantum circuit elements, such as superconducting qubits. Coupling may include bonding the carrier chip 24 to the qubit chip using, e.g., bump bonding, where the bump bonds maintain a fixed separation or gap between the carrier chip 24 and the qubit chip as shown in FIG. 2A.

Referring to FIG. 2A, the bump bonds 32 may include superconducting material such as indium and may be formed on thin film interconnecting pads (e.g., aluminum interconnect pads) having thin (e.g., a few nanometers) barrier layers (e.g., titanium nitride). In some implementations, the metal interconnect pads, have a thin native oxide layer on their surface which is removed using ion milling prior to formation of the barrier layer. Deposition of the barrier layer can include, e.g., performing reactive sputtering. After deposition of the barrier layer material, the barrier layer material may be patterned so as to just cover the surfaces of the interconnect pads. After deposition and patterning of the barrier layer, the exposed surfaces of the barrier layers can be optionally ion milled. Subsequently, a layer of superconducting material that will form the superconducting bump bonds is deposited on the surface of the barrier layers. The superconducting material can be deposited using, e.g., a thermal evaporation deposition process. As with the barrier layer, the as-deposited superconducting material forming the bump bonds 32 may be patterned using a combination of photolithography and wet or dry etching techniques (or lift-off) to define the bump bond regions.

The surfaces of the material that forms the bump bonds 32 on one or both the carrier chip 24 and the qubit chip 22 then are exposed to an $H_2$ plasma. After exposing the superconducting bump bonds to the $H_2$ plasma, the two chips are brought together and bonded to one another in a bump bonder to produce the quantum computing device. Pressure bonding may be performed under a vacuum and without heat applied (e.g., at room temperature). The range of pressure for the vacuum can be between approximately $10^{-7}$ Torr to approximately $10^{-9}$ Torr. The low temperature/room temperature pressure bonding can be performed using, e.g., the Bond Meister available from Mitsubishi Heavy Industries, Ltd.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Moreover, the separation of various components in the implementations described above should not be understood as requiring such separation in all implementations.

A number of implementations have been described. Nevertheless, it will be understood that various modifications may be made without departing from the spirit and scope of the invention. For instance, various examples are described herein in which circuit elements are formed on the capping layer. However, in some implementations, circuit elements may also be formed within the multilayer wiring stack including, e.g., microwave filters and other passive circuit elements that operate in the microwave frequency range, in addition to signal lines described herein Other implementations are within the scope of the following claims.

What is claimed is:

1. A method of fabricating a carrier chip for distributing signals among circuit elements of a quantum computing device, the method comprising:
   providing a multilayer wiring stack, the multilayer wiring stack comprising alternating layers of dielectric material and wiring;
   bonding a capping layer to the multilayer wiring stack, wherein the capping layer comprises a single crystal silicon dielectric layer;
   forming a via hole within the capping layer, wherein the via hole extends to a first wiring layer of the multilayer wiring stack;
   forming an electrically conductive via within the via hole and electrically coupled to the first wiring layer; and
   forming a circuit element on a surface of the capping layer, wherein the circuit element is directly electrically coupled to the electrically conductive via.

2. The method of claim 1, wherein the capping layer comprises a silicon-on-insulator (SOI) wafer.

3. The method of claim 2, comprising:
   prior to forming the via hole, removing a buried oxide layer and a bulk silicon layer of the SOI wafer to expose the surface of the capping layer.

4. The method of claim 1, wherein a thickness of the capping layer between the multilayer wiring stack and the surface of the capping layer is between about 2 microns and about 20 microns.

5. The method of claim 1, wherein the multilayer wiring stack comprises a metal carrier bonding layer,
   the capping layer comprises a metal capping bonding layer, and
   wherein bonding the capping layer to the multilayer wiring stack comprises bonding the metal carrier bonding layer directly to the metal capping bonding layer.

6. The method of claim 1, wherein bonding the capping layer to the multilayer wiring stack comprises bonding a first dielectric layer of the multilayer wiring stack directly to the single crystal silicon dielectric layer of the capping layer.

7. The method of claim 1, wherein the multilayer wiring stack comprises a metal carrier bonding layer, and
   wherein bonding the capping layer to the multilayer wiring stack comprises bonding the metal carrier bonding layer directly to the single crystal silicon dielectric layer of the capping layer.

8. The method of claim 1, wherein the capping layer comprises a metal capping bonding layer, and
   wherein bonding the capping layer to the multilayer wiring stack comprises bonding the metal capping bonding layer directly to the a first dielectric layer of the multilayer wiring stack.

9. The method of claim 1, wherein the circuit element comprises a qubit readout resonator.

10. The method of claim 1, wherein each of the wiring within the multilayer wiring stack, the electrically conductive via within the via hole, and the circuit element on the capping layer comprises a superconductor.

11. The method of claim 10, wherein the superconductor comprises at least one of aluminum, niobium, indium, niobium titanium nitride, or titanium nitride.

12. The method of claim 1, wherein the layers of dielectric material within the multilayer wiring stack comprise vapor deposited oxide layers.

13. The method of claim 1, wherein the multilayer wiring stack comprises at least one additional circuit element formed within at least one of the wiring layers, wherein the at least one additional circuit element comprises a circuit element configured to operate in a microwave frequency between about 300 MHz and about 300 GHz.

14. The method of claim 1, further comprising:
   coupling a qubit chip comprising at least one qubit to the carrier chip that comprises the multilayer wiring stack bonded to the capping layer, such that there is a gap between the qubit chip and the carrier chip.

15. The method of claim 14, wherein coupling the qubit chip comprising the at least one qubit to the carrier chip comprises bump-bonding the qubit chip to the carrier chip.

16. A carrier chip for distributing signals among circuit elements of a quantum computing device, the carrier chip comprising:
   a multilayer wiring stack comprising alternating layers of dielectric material and wiring;
   a capping layer bonded to the multilayer wiring stack, the capping layer comprising a single crystal silicon dielectric layer;
   a via hole within the capping layer, wherein the via hole extends to a first wiring layer of the multilayer wiring stack;
   an electrically conductive via within the via hole and electrically coupled to the first wiring layer of the multilayer stack; and
   a circuit element on a surface of the capping layer, wherein the circuit element is directly electrically coupled to the electrically conductive via.

17. The carrier chip of claim 16, wherein a thickness of the single crystal silicon dielectric layer between the multilayer wiring stack and the surface of the capping layer is between about 2 microns and about 20 microns.

18. The carrier chip of claim 16, wherein the capping layer comprises a first metal layer, the multilayer wiring stack comprises a second metal layer, and the first metal layer is directly bonded to the second metal layer.

19. The carrier chip of claim 16, wherein the capping layer comprises a first metal layer, and the first metal layer is directly bonded to a dielectric layer of the multilayer wiring stack.

20. The carrier chip of claim 16, wherein the multilayer wiring stack comprises a first metal layer, and the first metal layer is directly bonded to the single crystal silicon layer.

21. The carrier chip of claim 16, wherein the circuit element comprises a qubit readout resonator.

22. The carrier chip of claim 16, wherein each of the wiring layers within the multilayer wiring stack, the electrically conductive via within the via hole, and the circuit element on the capping layer comprises a superconductor.

23. The carrier chip of claim 22, wherein the superconductor comprises at least one of aluminum, indium, niobium, niobium titanium nitride, or titanium nitride.

24. The carrier chip of claim 16, wherein the layers of dielectric material within the multilayer wiring stack comprise vapor deposited oxide layers.

25. The carrier chip of claim 16, wherein the multilayer wiring stack comprises at least one additional circuit element formed within at least one of the wiring layers, wherein the at least one additional circuit element comprises a circuit element configured to operate in a microwave frequency between about 300 MHz and about 300 GHz.

26. A quantum computing device comprising:
a multilayer wiring stack comprising alternating layers of dielectric material and wiring;
a capping layer bonded to the multilayer wiring stack, the capping layer comprising a single crystal silicon dielectric layer;
a via hole within the capping layer, wherein the via hole extends to a first wiring layer of the multilayer wiring stack;
an electrically conductive via within the via hole and electrically coupled to the first wiring layer of the multilayer stack;
a circuit element on a surface of the capping layer, wherein the circuit element is directly electrically coupled to the electrically conductive via; and
a chip coupled to the capping layer, wherein the chip comprises at least one qubit.

27. The quantum computing device of claim 26, wherein a thickness of the single crystal silicon dielectric layer between the multilayer wiring stack and the surface of the capping layer is between about 2 microns and about 20 microns.

28. The quantum computing device of claim 26, wherein the capping layer comprises a first metal layer, the multilayer wiring stack comprises a second metal layer, and the first metal layer is directly bonded to the second metal layer.

29. The quantum computing device of claim 26, wherein the capping layer comprises a first metal layer, and the first metal layer is directly bonded to a dielectric layer of the multilayer wiring stack.

30. The quantum computing device of claim 26, wherein the multilayer wiring stack comprises a first metal layer, and the first metal layer is directly bonded to the single crystal silicon layer.

31. The quantum computing device of claim 26, wherein the circuit element comprises a qubit readout resonator, and the qubit readout resonator is aligned with a first qubit on the chip.

32. The quantum computing device of claim 26, wherein each of the wiring layers within the multilayer wiring stack, the electrically conductive via within the via hole, and the circuit element on the capping layer comprises a superconductor.

33. The quantum computing device of claim 32, wherein the superconductor comprises at least one of aluminum, niobium, indium or titanium nitride.

34. The quantum computing device of claim 26, wherein the layers of dielectric material within the multilayer wiring stack comprise vapor deposited oxide layers.

35. The quantum computing device of claim 26, wherein the multilayer wiring stack comprises at least one additional circuit element formed within at least one of the wiring layers, wherein the at least one additional circuit element comprises a circuit element configured to operate in a microwave frequency between about 300 MHz and about 300 GHz.

36. The quantum computing device of claim 26, wherein there is a gap between the chip and the capping layer.

37. The quantum computing device of claim 26, wherein the chip is bump-bonded to the capping layer.

* * * * *